(12) United States Patent
Hirota

(10) Patent No.: US 7,825,004 B2
(45) Date of Patent: Nov. 2, 2010

(54) METHOD OF PRODUCING SEMICONDUCTOR DEVICE

(75) Inventor: Toshiyuki Hirota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 169 days.

(21) Appl. No.: 11/882,991

(22) Filed: Aug. 8, 2007

(65) Prior Publication Data

US 2008/0050886 A1 Feb. 28, 2008

(30) Foreign Application Priority Data

Aug. 23, 2006 (JP) .............................. 2006-226250

(51) Int. Cl.
*H01L 21/76* (2006.01)
(52) U.S. Cl. ...................... 438/424; 438/928
(58) Field of Classification Search .................. 438/424
See application file for complete search history.

(56) References Cited

U.S. PATENT DOCUMENTS

| 5,562,770 | A | * | 10/1996 | Chen et al. ................... 438/202 |
| 5,985,743 | A | * | 11/1999 | Gardner ....................... 438/527 |
| 6,297,128 | B1 | * | 10/2001 | Kim et al. .................... 438/437 |
| 6,734,082 | B2 | * | 5/2004 | Zheng et al. ................. 438/435 |
| 6,844,237 | B1 | * | 1/2005 | Jin et al. ...................... 438/424 |
| 7,238,586 | B2 | * | 7/2007 | Hsu et al. .................... 438/424 |
| 2005/0253199 | A1 | | 11/2005 | Nagaoka |

FOREIGN PATENT DOCUMENTS

| JP | 63-015439 | 1/1988 |
| JP | 08-153862 | 6/1996 |
| JP | 2004-111828 A | 4/2004 |
| JP | 2004-158711 | 6/2004 |
| JP | 2005-286091 A | 10/2005 |
| JP | 2005-322859 A | 11/2005 |
| JP | 2005-340734 | 12/2005 |
| JP | 2005-340734 A | 12/2005 |
| JP | 2006-120703 A | 5/2006 |

* cited by examiner

*Primary Examiner*—Charles D Garber
*Assistant Examiner*—Bryan R Junge
(74) *Attorney, Agent, or Firm*—Foley & Lardner LLP

(57) ABSTRACT

A method of producing a semiconductor device according to the present invention comprises steps of:
(A) forming trenches (13) on the front surface (FS) of a semiconductor substrate (11) on the back surface (BS) of which a nitride film (12b) is formed;
(B) depositing an insulating film (15) to bury the trenches (13);
(C) removing the nitride film (12b) on the back surface (BS) of the semiconductor substrate (11) after the step (B); and
(D) annealing before the insulating film (15) is etched after the step (C).

24 Claims, 9 Drawing Sheets

METHOD OF PRODUCING SEMICONDUCTOR DEVICE

This application is based upon and claims the benefit of priority from Japanese patent application No. 2006-226250, filed on Aug. 23, 2006, the disclosure of which is incorporated herein in its entirety by reference.

BACKGROUND OF THE INVENTION

1. Field of the Invention

The present invention relates to a method of producing a semiconductor device, and particularly, to a method of producing a semiconductor device comprising device isolation structure.

2. Related Art

There has been known a shallow trench isolation (STI) as device isolation structure in a semiconductor device. The STI structure is formed such that an insulating film is deposited on a semiconductor substrate in which trenches are formed to bury the trenches with the insulating film. A chemical vapor deposition (CVD) method is generally used to deposit the insulating film.

Hitherto, an insulating film has been deposited by a high-density plasma (HDP) CVD method, for example. However, further miniaturization of a device has increased the aspect ratio of a trench, which has made it difficult to bury trenches by the HDP-CVD method. For this reason, other vapor deposition methods having more excellent coverage has drawn attention instead of the HDP-CVD method in recent years. Such vapor deposition methods include a sub-atmospheric (SA) CVD method using gases containing $O_3$ (ozone)-TEOS (tetraethoxysilane) and an atomic layer deposition (ALD) method. These methods are excellent in coverage and characterized in that a conformal thin film can be formed.

A method of forming a semiconductor device according to a related art will be described below with reference to FIGS. 1A to 1C and FIGS. 2A to 2E.

First, an oxide film (not shown) is formed on semiconductor substrate (semiconductor wafer) 1 by a thermal oxidation process. Then, silicon nitride film (SiN film) 2 is formed by a low-pressure (LP) CVD method. At this point, SiN film 2 is deposited on both sides of semiconductor substrate 1 as illustrated in FIG. 1A. That is to say, on front surface FS of semiconductor substrate 1 is formed SiN film 2*a*, and on back surface BF of semiconductor substrate 1 is formed SiN film 2*b*. SiN film 2 exerts a strong tensile stress on semiconductor substrate 1. However, the stress is in balance on the front and the back surface in a phase illustrated in FIG. 1, so that "warpage" does not appear on semiconductor substrate 1.

A mask is formed from SiN film 2*a* on front surface FS of semiconductor substrate 1 through photolithography and etching. The mask is used to form an STI structure and has a pattern corresponding to the STI structure. SiN film 2*a*, as illustrated in FIG. 1B, is segmented by patterning to release the stress. As a result, stress is imbalanced between front surface FS and back surface BS to convexly warp front surface FS of semiconductor substrate 1. In other words, a tensile stress of SiN film 2*b* on back surface BS convexly warps semiconductor substrate 1.

Exposed portions on semiconductor substrate 1 are subjected to dry etching using the mask to form trenches 3 in front surface FS of semiconductor substrate 1 as illustrated in FIG. 1B. Subsequently, oxidation treatment is performed to form 10 to 15 nm thick oxide film 4 on the inner walls of trenches 3. After that, 6 to 8 nm thick SiN film is formed as liner film (not shown). The liner film plays a role to suppress the oxidation of semiconductor substrate 1 at the following steam anneal process and oxidation process.

As illustrated in FIG. 1C, oxide film 5 is deposited to cover front surface FS of semiconductor substrate 1 by the SA-CVD method using gases containing $O_3$-TEOS. As a result, trenches 3 are buried with oxide film 5. Oxide film 5 deposited by this method is referred to as "$O_3$-TEOS-USG (undoped silicate glass)." The above SA-CVD method has an excellent coverage, and $O_3$-TEOS-USG to be formed is a conformal film.

Care must be devoted to portions poor in film quality referred to as "seam" when trenches 3 are buried with the conformal film. The term "seam" refers to a line where the edges of two films growing from both side walls in trench 3 touch each other. As illustrated in FIG. 1C, oxide films 5 deposited in each trench 3 are joined with each other to form seam SE in each trench 3. Large aspect ratio of trench 3 makes seams SE particularly conspicuous. The etching rate of wet etching to seams SE is higher than that to other portions of the film, which is unfavorable for processing.

Then, annealing is performed in an atmosphere of water vapor at temperatures of 700° C. to 950° C. (steam anneal process) to improve the film quality of the entire oxide film 5 including seams SE. Furthermore, annealing is performed in an atmosphere of inert gas ($N_2$) at a temperature of 1100° C. This intends oxide film 5 to be densified. However, seams SE cannot be completely removed by such an annealing process in the related art. Particularly, in recent years, the aspect ratio of trench 3 has tended to increase in accordance with miniaturization of a device, so that it is very difficult to eliminate seams SE.

FIG. 2A illustrates an enlarged periphery of trench 3. As illustrated in FIG. 2A, trenches 3 are formed on front surface FS of semiconductor substrate 1. Oxide film 4 is formed on the inner wall of trench 3. Oxide film 5 is formed to bury trenches 3. Seams SE are formed at positions corresponding to trenches 3 inside oxide film 5.

As illustrated in FIG. 2B, chemical mechanical polishing (CMP) is performed to such an extent that SiN film 2*a* is exposed. As a result, STI structure 6 is formed in which trench 3 is buried with oxide film 5. Seams SE exist in STI structure 6.

As illustrated in FIG. 2C, oxide film 5 between adjacent masks (SiN film 2*a*) is removed by wet etching using fluorinated acid. The etching rate of wet etching to seams SE is higher than that to other portions, so that oxide film 5 around seam SE is etched faster. As a result, slit dents DE are formed at positions corresponding to seams SE on the surface of STI structure 6.

As illustrated in FIG. 2D, SiN film 2*a* used as a mask is removed by etching. Wet etching is performed by, for example, phosphoric acid heated to temperatures of 140° C. to 160° C. In this process, SiN film 2*b* formed on back surface BS of semiconductor substrate 1 is also removed at the same time. Incidentally, dents DE still remain on the surface of STI structure 6.

As illustrated in FIG. 2E, gate oxide film (not shown), gate polysilicon film 7, tungsten film 8 and SiN film 9 are sequentially deposited in this order. After that, a gate electrode of an MOS transistor is formed by photolithography technique and dry etching technique.

However, in this case, a conductor (i.e., gate polysilicon film 7) used as a material of the gate electrode is deposited also in dents DE. Even after a gate electrode is formed by dry etching, the conductor in dents DE may not be completely removed. The conductor remaining inside dents DE causes a short circuit between adjacent gate electrodes to deteriorate yield. Better technique is demanded to solve problems resulting from seams SE in oxide film 5.

There have been known the following techniques for solving problems resulting from a stress exerted on a semiconductor substrate.

Japanese Patent Laid-Open No. 2004-158711 describes that STI structure is formed with an SOI wafer concavely warped and thereafter the warp of the SOI wafer is corrected to generate a crack in the STI structure. The concave warp results from a compressive stress film (or a polycrystalline silicon film) formed on the back surface of the SOI wafer. According to a technique for solving the problem described in this document, the compressive stress film on the back surface of the SOI wafer is removed and then the STI structure is formed.

Japanese Patent Laid-Open No. 2005-340734 describes a technique for decreasing a stress resulting from a silicon nitride film for forming the side wall of a gate electrode. When a silicon nitride film is deposited, it is formed not only on the front surface of a semiconductor substrate, but also on the back surface thereof. The above document indicates that the stress resulting from the silicon nitride film on the back surface thereof deteriorates characteristics of an MOS transistor. According to the technique for solving the problem described in this document, the silicon nitride film is deposited and then an antifouling oxide silicon film is selectively formed only on the front surface of the semiconductor substrate. The silicon oxide film is used as a mask to selectively etch the silicon nitride film on the back surface thereof. After that, the silicon oxide film on the front surface is selectively etched. Then, the silicon nitride film on the front surface is subjected to anisotropic etching to form the side wall of a gate electrode.

SUMMARY OF THE INVENTION

An object of the present invention is to provide a technique capable of solving problems resulting from seams in a deposited film.

Another object of the present invention is to provide a technique capable of improving the yield of a semiconductor device.

The present invention is described below using reference numbers and characters used in the drawings, but not limited to the description.

A method of producing a semiconductor device is provided in a first aspect of the present invention. The method of producing a semiconductor device comprises steps of:

(A) forming trenches (13) on the front surface (FS) of a semiconductor substrate (11) in which a nitride film (12b) is formed on the back surface (BS) thereof;

(B) depositing an insulating film (15) to bury the trenches (13);

(C) removing the nitride film (12b) on the back surface (BS) of the semiconductor substrate (11) after the step (B); and (D) annealing the semiconductor substrate before the insulating film (15) is etched and after the step (C).

The insulating film (15) is formed by a vapor deposition method having an excellent coverage in the step (B). The insulating film (15) is formed by, for example, a sub-atmospheric chemical vapor deposition (SA-CVD) method or an atomic layer deposition (ALD) method. At this point, seams (SE) are probably generated in the insulating film (15) deposited inside the trenches (13).

The inventers' attention is directed to a stress exerted on seams (SE) in the steam annealing step after the formation of the insulating film. The inventers have found that the stress is controlled to enable the degree of seams (SE) to be improved. The stress exerted on seams (SE) depends on the warpage of the semiconductor substrate (11). The degree of warpage is controlled to enable the stress exerted on seams (SE) to be indirectly controlled.

The nitride film (12b) is deposited on the back surface (BS) of the semiconductor substrate (11) in the above step (B). Tensile stress of the nitride film (12b) on the back surface (BS) convexly warps the front surface (FS) of the semiconductor substrate (11). A convex warpage acts in a direction to expand seams (SE) in the insulating film (15) inside the trenches (13). It is conceivable that the convex warpage is decreased to allow the bonding force of the film in the seam (SE) to be strengthened. The nitride film (12b) on the back surface (BS) exerting a strong tensile stress may be removed to decrease the convex warpage.

According to the present invention, the nitride film (12b) on the back surface (BS) of the semiconductor substrate (11) is removed in the step (C) after the step (B). This decreases a stress expanding the seams (SE). Since the film quality of the insulating film (15) inside the trench (13) is improved in a steam annealing (the step (D)), the step (C) is desirably implemented prior to the steam annealing. That is to say, annealing is performed in the step (D) after the step (C). The bonding force of the film in the seams (SE) is strengthened to enable the seams (SE) to be sufficiently destroyed by this annealing.

After the step (D), a part of the insulating film (15) is etched to form the device isolation structure (16). Since the seams (SE) in the insulating film (15) sufficiently disappear, conventional "dents (DE)" are not made on the surface of the device isolation structure (16) in the etching process. Short-circuit is therefore prevented resulting from conductors remaining in the "dents (DE)" when a semiconductor device is formed on the front surface (FS) of the semiconductor substrate (11). For example, short circuit between gate electrodes of adjacent MOS transistors is prevented. As a result, the yield of a semiconductor device is improved. Thus, according to the present invention, it is enabled to solve a problem resulting from a seam.

A method of producing a semiconductor device is provided in a second aspect of the present invention. The method of producing a semiconductor device comprises steps of:

(a) forming trenches (13) on the front surface (FS) of a semiconductor substrate (11);

(b) depositing an insulating film (15) to bury the trenches (13) while exerting a stress in such a direction that the front surface (FS) of the semiconductor substrate (11) is convexly warped;

(c) decreasing a stress after the step (b); and (d) annealing after the step (c).

The step (d) is desirably implemented before the insulating film (15) is etched.

According to the present invention, a stress exerted on seams in the deposited film is controlled to promote the removal of the seams in the annealing step. For this reason, a problem resulting from seams in the deposited film is solved. For example, "dents" are prevented from being formed on the surface of the device isolation structure to prevent short circuit resulting from a conductor remaining in the "dents." As a result, the yield of a semiconductor device is improved.

DETAILED DESCRIPTION OF THE PREFERRED EMBODIMENTS

A method of producing a semiconductor device according to an exemplary embodiment is described below with reference to FIGS. 3A to 3D and FIGS. 4A to 4E.

Figure 1A:
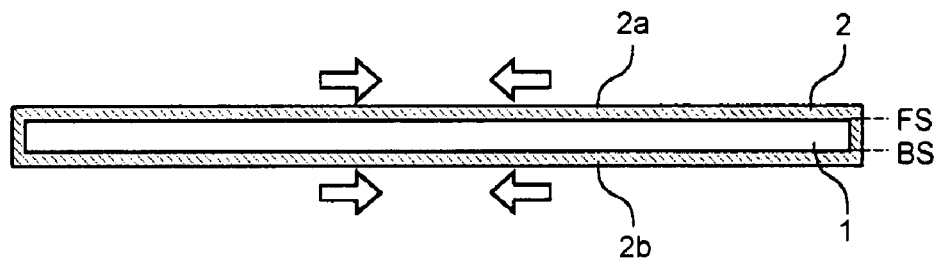
FIGS. 1A to 1C are cross sections illustrating the production process of a semiconductor device according to a first related art.
Figure 1B:
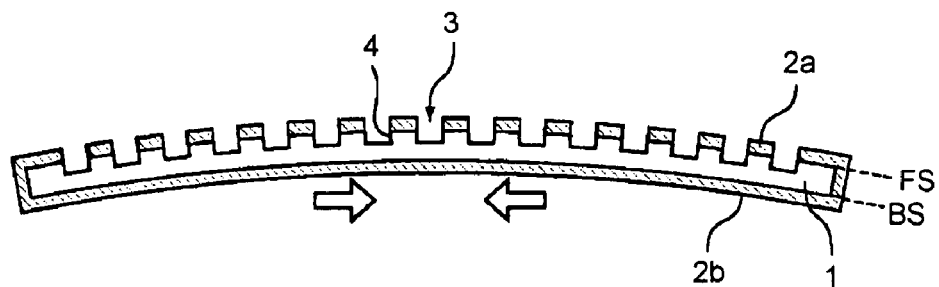
Figure 1C:
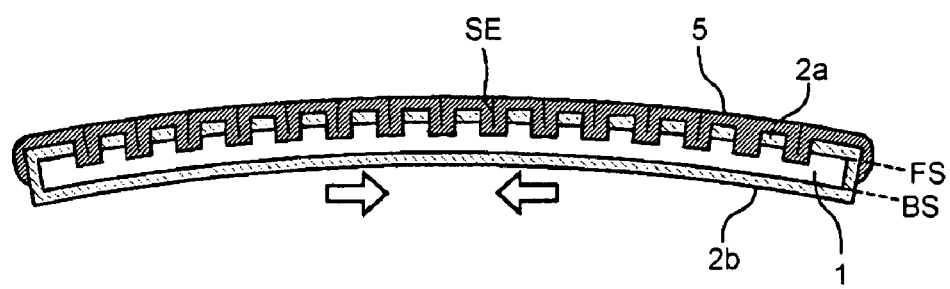
Figure 2A:
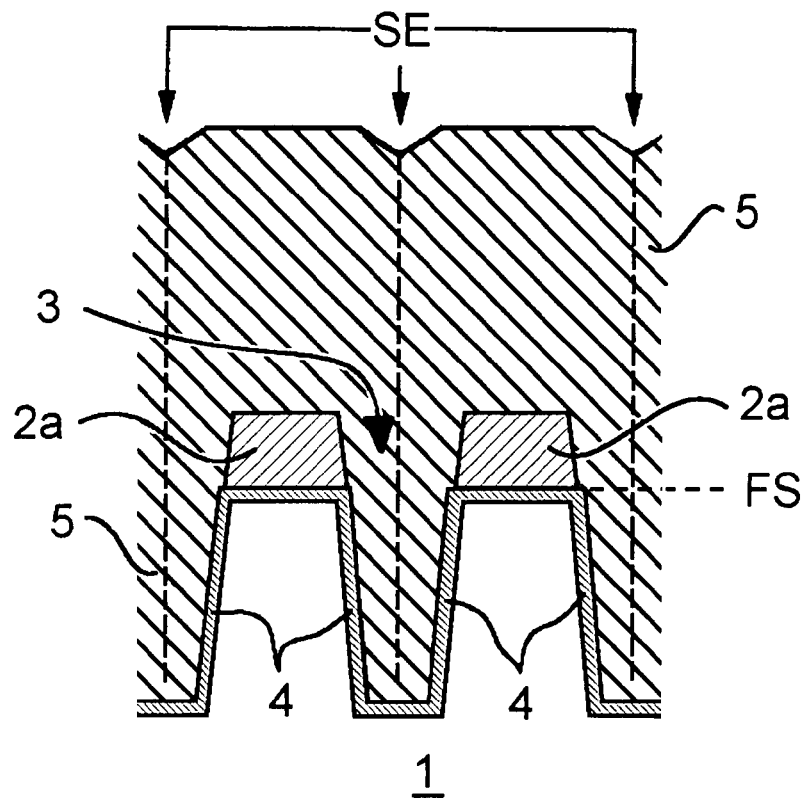
FIGS. 2A to 2E are cross sections illustrating the production process of a semiconductor device according to a second related art.
Figure 2B:
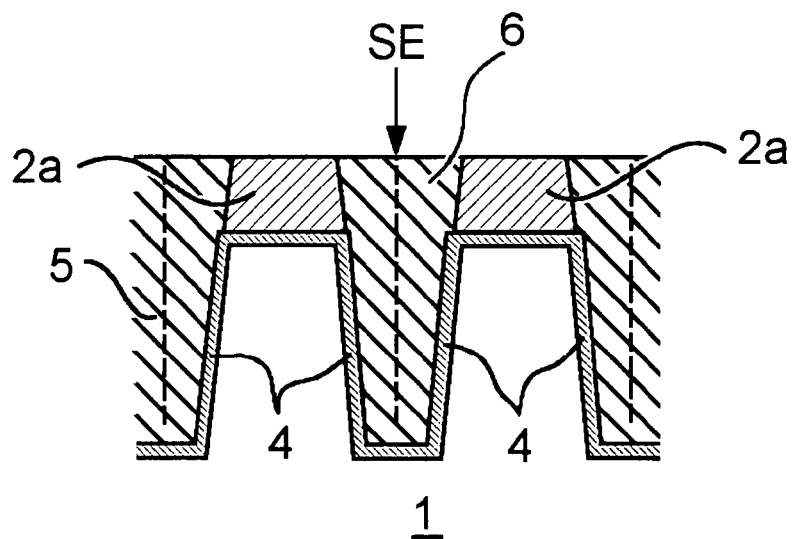
Figure 2C:
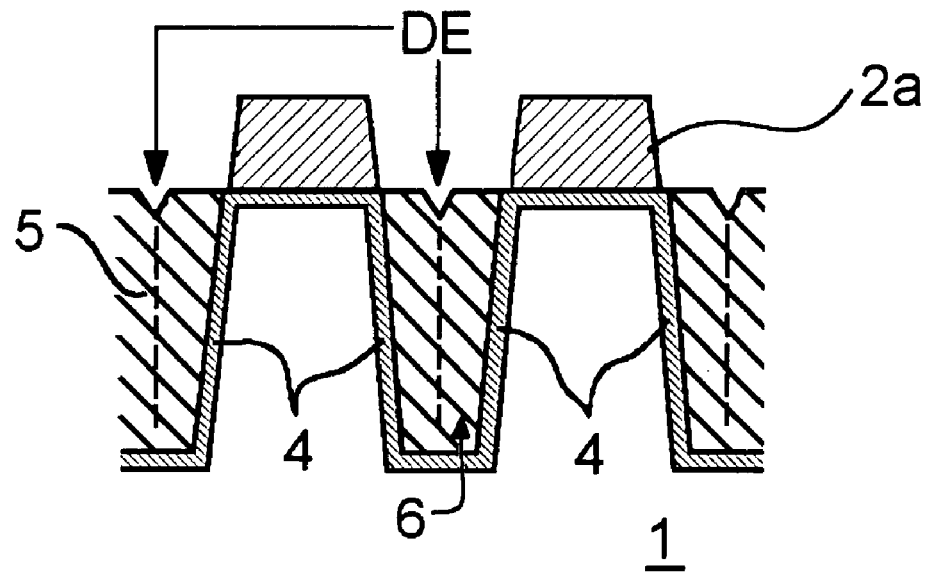
Figure 2D:
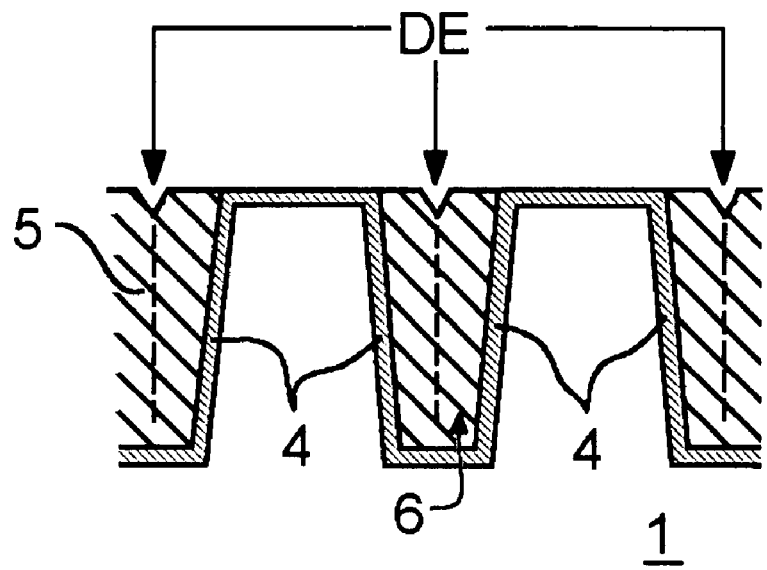
Figure 2E:
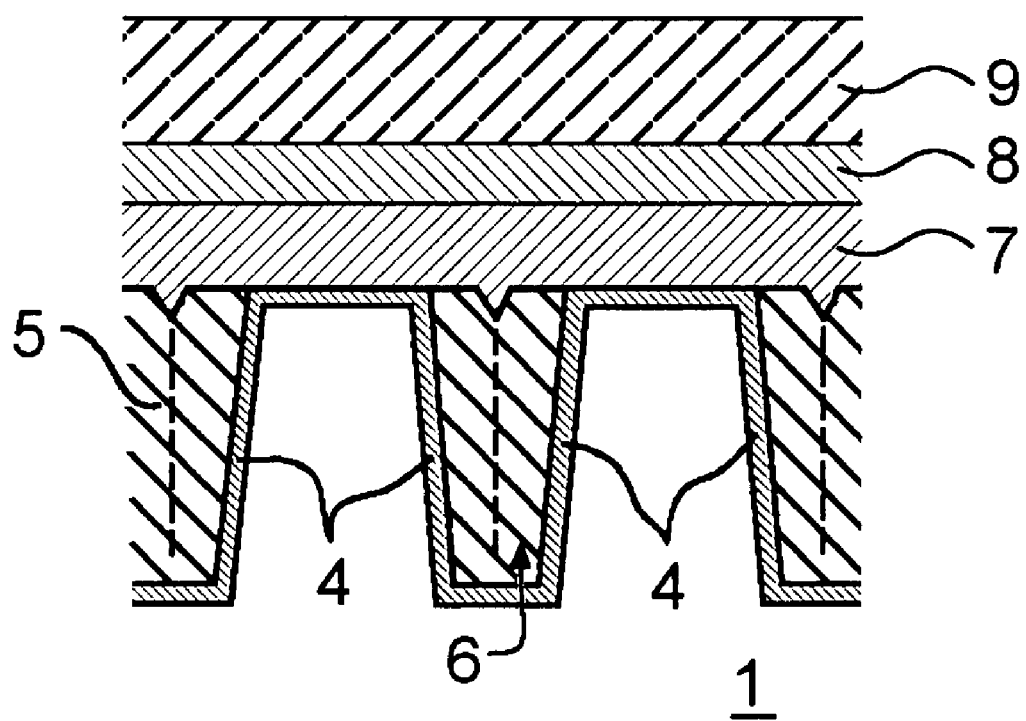
Figure 3A:
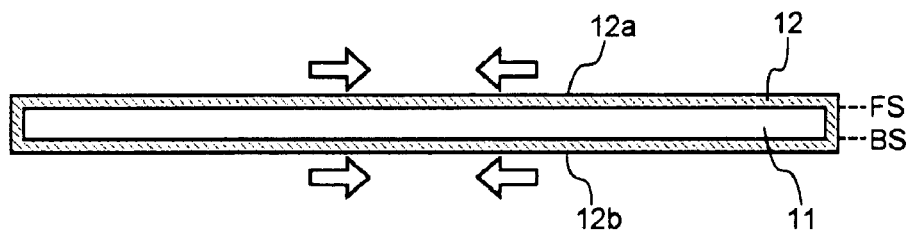
FIGS. 3A to 3D are cross sections illustrating the production process of a semiconductor device according to an exemplary embodiment.

First, an oxide film (not shown) is formed on semiconductor substrate (semiconductor wafer) 11 by a thermal oxidation process. Then, silicon nitride film (SiN film) 12 is formed by an LP-CVD method. At this point, SiN film 12 is deposited on both sides of semiconductor substrate 11 as illustrated in FIG. 3A. That is to say, on front surface FS of semiconductor substrate 11 is formed SiN film 12a, and on back surface BF of semiconductor substrate 11 is formed SiN film 12b. SiN film 12 exerts a strong tensile stress on semiconductor substrate 11. However, the stress is in balance between front surface FS and back surface BS in the phase illustrated in FIG. 3A, so that "warpage" is not generated on semiconductor substrate 11.

Figure 3B:
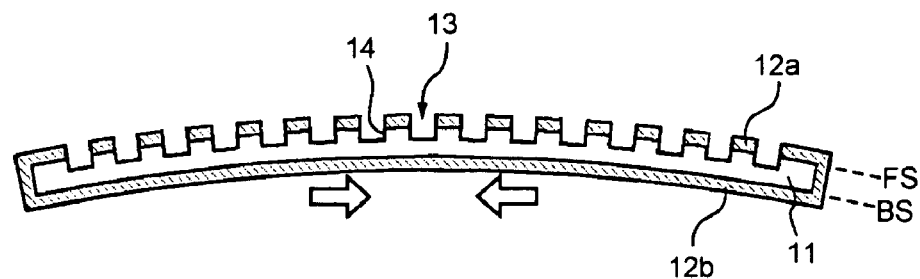

A mask is formed from SiN film 12a on front surface FS of semiconductor substrate 11 through photolithography and etching. The mask is used to form the STI structure and has a pattern according to the STI structure. SiN film 12a, as illustrated in FIG. 3B, is segmented by patterning to release the stress. As a result, a stress is imbalanced between front surface FS and back surface BS to convexly warp front surface FS of semiconductor substrate 11. In other words, a tensile stress of SiN film 12b on back surface BS convexly warps semiconductor substrate 11.

Exposed portions on semiconductor substrate 11 are subjected to dry etching using the mask to form trenches 13 in front surface FS of semiconductor substrate 11 as illustrated in FIG. 3B. Subsequently, oxidation treatment is performed to form 10 to 15 nm thick oxide film 14 on the inner walls of trenches 13. After that, 6 to 8 nm thick SiN film is formed as a liner film (not shown). The liner film plays a role to suppress the oxidation of semiconductor substrate 11 at the following steam annealing process and oxidation process.

Figure 3C:
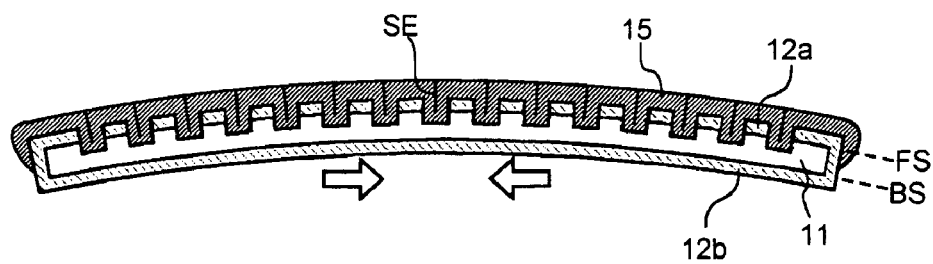

As illustrated in FIG. 3C, insulating film (or oxide film) 15 is deposited to cover front surface FS of semiconductor substrate 11. As a result, trenches 13 are buried with insulating film 15. This insulating film (oxide film) 15 is formed by the SA-CVD method using gases containing $O_3$-TEOS, for example. In this case, insulating film 15 is formed of $O_3$-TEOS-USG. Insulating film 15 may be formed by the ALD or the LP-CVD method. The above vapor deposition methods have an excellent coverage, and insulating film 15 to be formed is a conformal film. Consequently, seams SE are formed in insulating film 15 inside trenches 13 as illustrated in FIG. 3C.

Front surface FS of semiconductor substrate 11 is convexly warped in the deposition process of insulating film 15. In other words, insulating film 15 is deposited with a stress exerted in such a direction that the front surface FS of semiconductor substrate 11 is convexly warped. Such a stress acts in such a direction as to "expand" seams SE. In order to strengthen the bonding force between the films in seam SE, such a stress should decrease.

Figure 3D:
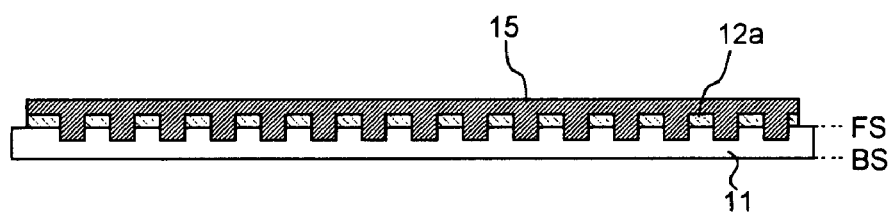

Then, a step is implemented to decrease the stress exerted on semiconductor substrate 11 following the deposition step of insulating film 15 illustrated in FIG. 3C. Specifically, SiN film 12b on back surface BS exerting a strong tensile stress is removed as illustrated in FIG. 3D. Tool such as, for example, a back-surface spin etcher is used to remove only SiN film 12b on back surface BS. This removes a tensile stress caused by SiN film 12b to decrease the warpage of semiconductor substrate 11 and weaken a force to expand seams SE. Thus, controlling a degree of warpage of semiconductor substrate 11 indirectly controls a stress exerted on seams SE.

Then, annealing is performed in an atmosphere of water vapor at temperatures of 700° C. to 950° C. (steam anneal process) to improve the film quality of the entire insulating film 15 including seams SE. Furthermore, annealing is performed in an atmosphere of inert gas (such as $N_2$) at a temperature of 1100° C. Insulating film 15 is densified by this procedure. According to the present exemplary embodiment, the bonding force of the films in seams SE is strengthened to promote the removal of seams in the annealing step. That is, seams SE are enabled to be sufficiently removed in the annealing step. As a result, portions poor in film quality hardly exist in insulating film 15.

Figure 4A:
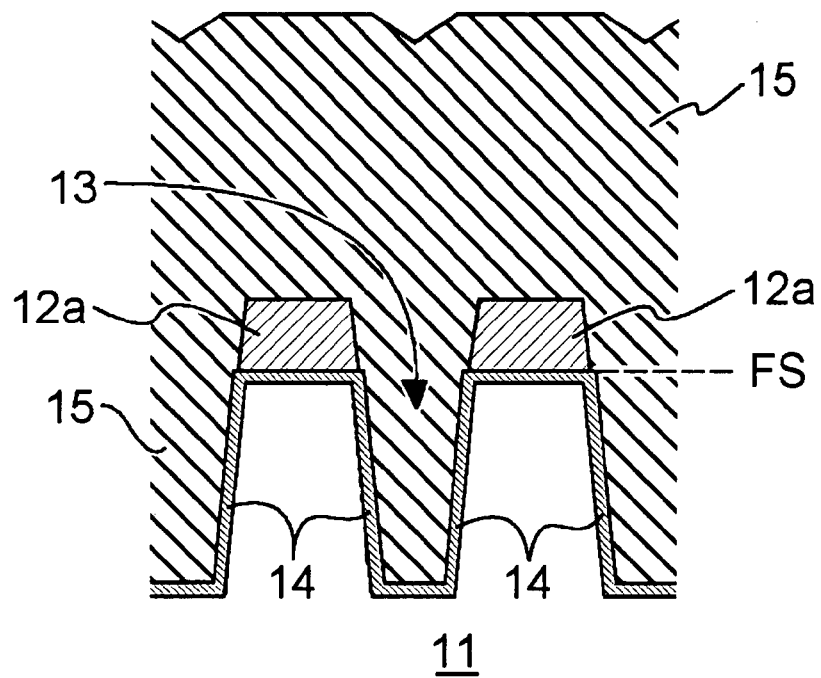
FIGS. 4A to 4E are cross sections illustrating the production process of a semiconductor device according to another exemplary embodiment.

FIG. 4A illustrates an enlarged periphery of trenches 13 subjected to the annealing step. As illustrate in FIG. 4A, trenches 13 are formed on front surface FS of semiconductor substrate 11. Oxide film 14 is formed on the inner wall of trench 13. Insulating film 15 is formed to bury trench 13. It should be noted that seams SE do not exist in insulating film 15.

Figure 4B:
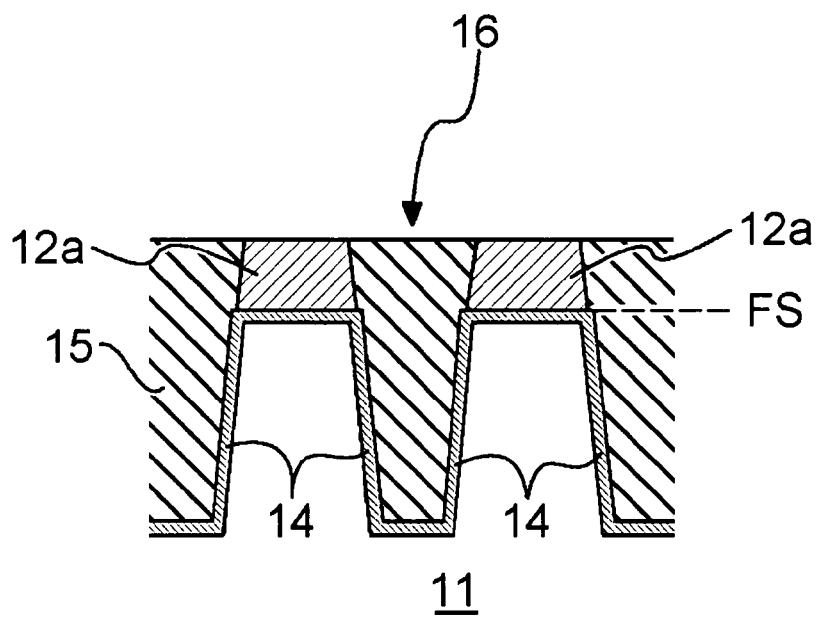

As illustrated in FIG. 4B, CMP is performed to such an extent that SiN film 12a is exposed. As a result, STI structure 16 is formed in which trenches 13 are buried with insulating film 15.

Figure 4C:
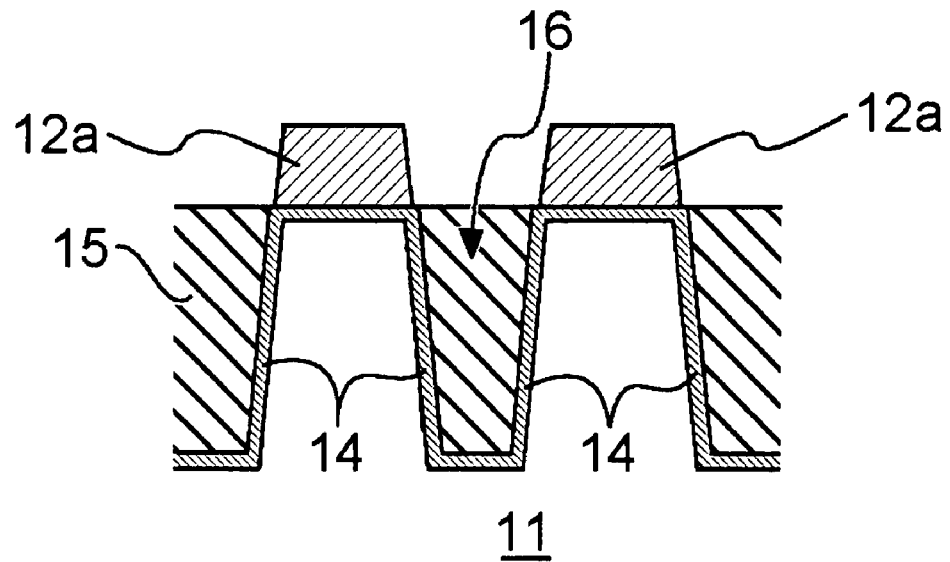

As illustrated in FIG. 4C, insulating film 15 between adjacent masks (SiN film 12a) is removed by wet etching using hydrofluoric acid. Since seams SE in insulating film 15 have disappeared, a conventional "dent DE" is not made on the surface of STI structure 16 in the etching step.

Figure 4D:
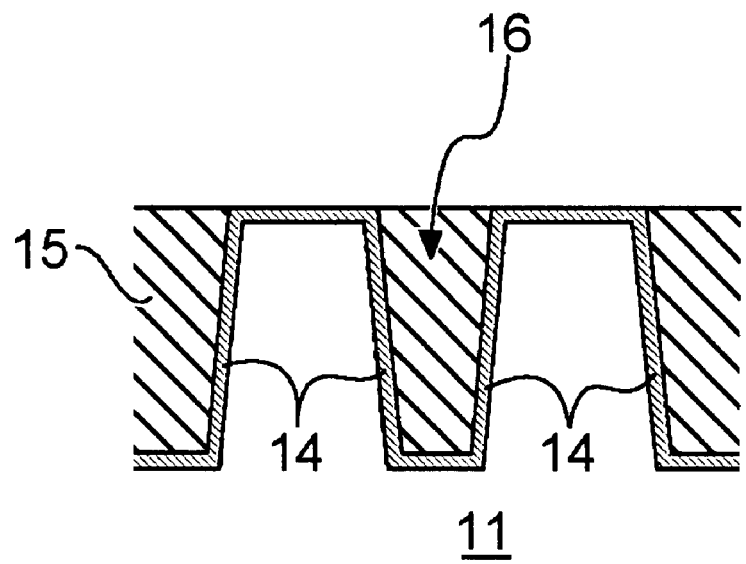

As illustrated in FIG. 4D, SiN film 12a used as a mask is removed by etching. Wet etching is performed by, for example, phosphoric acid heated to temperatures of 140° C. to 160° C.

Figure 4E:
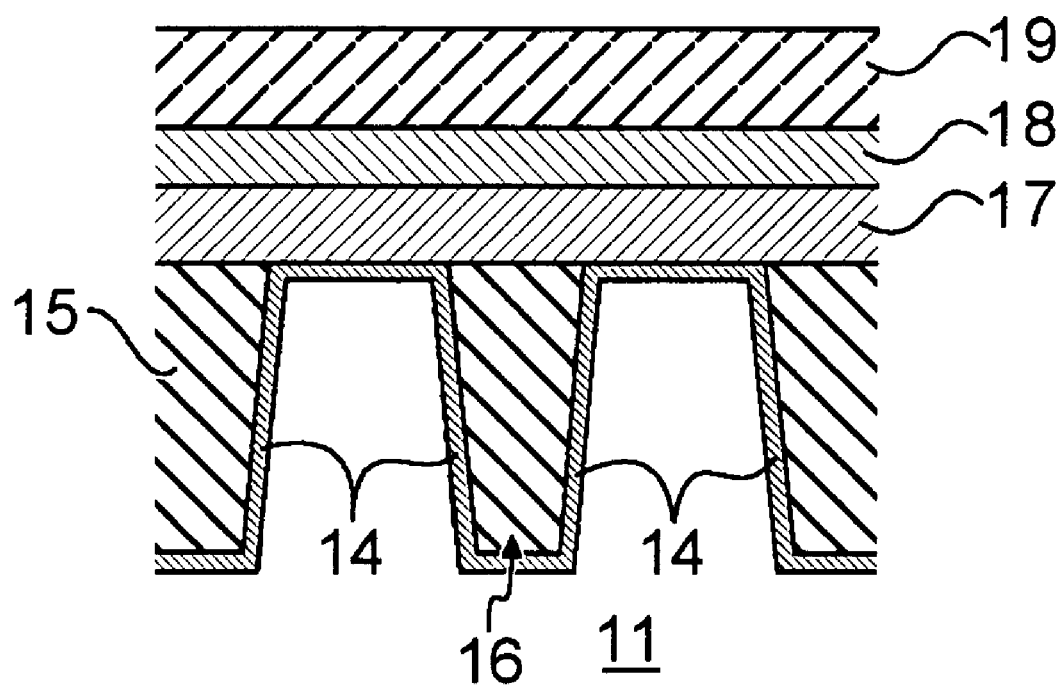

As illustrated in FIG. 4E, gate oxide film (not shown), gate polysilicon film 17, tungsten film 18 and SiN film 19 are sequentially deposited in this order. After that, a gate electrode of an MOS transistor is formed by photolithography technique and dry etching technique. According to the present exemplary embodiment, "dent DE" is not formed on the surface of STI structure 16. For this reason, such a problem is prevented that a conductor remaining inside dent DE causes a short circuit between adjacent gate electrodes. As a result, the yield of a semiconductor device is improved.

Figure 5:
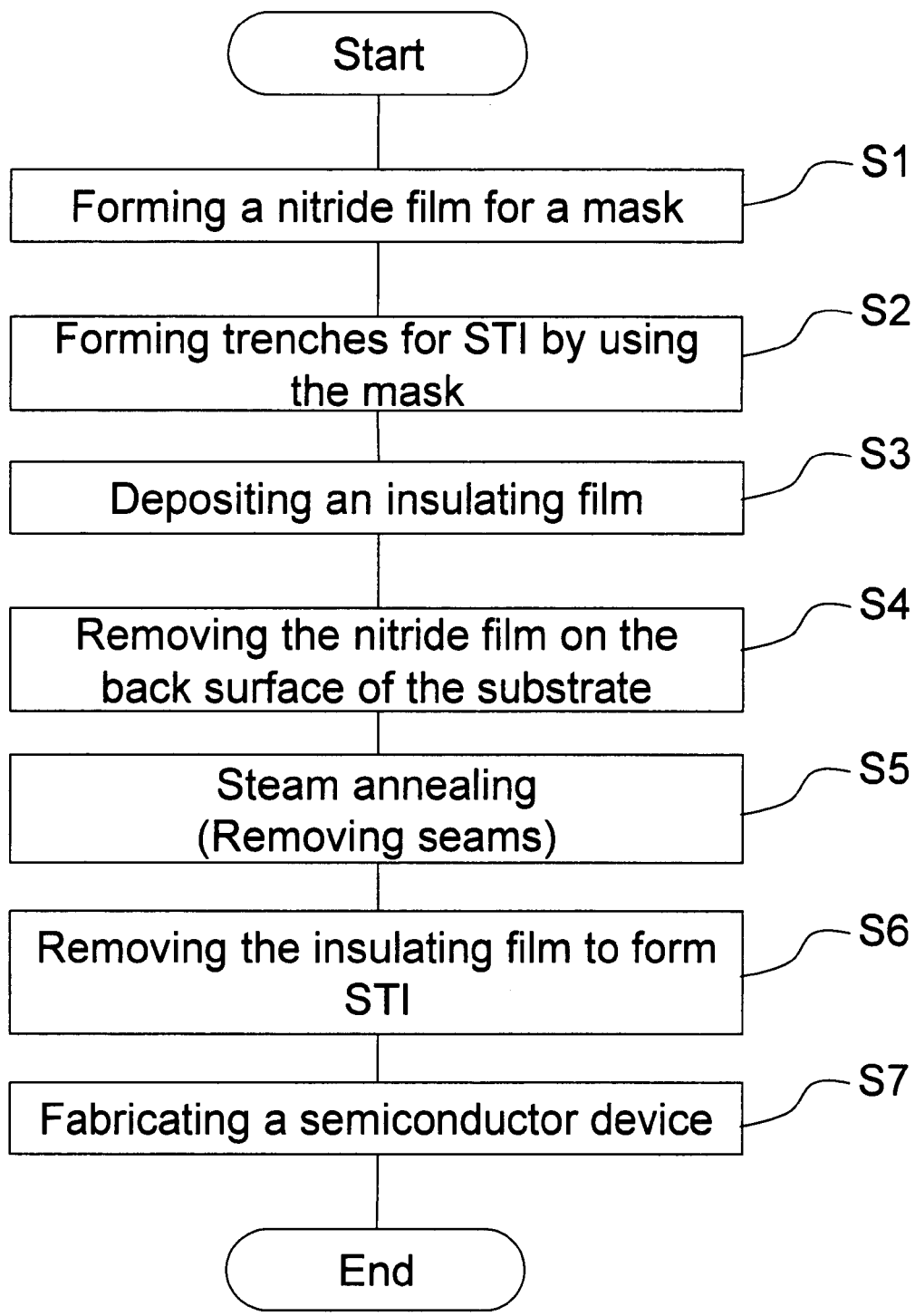
FIG. 5 is a schematic flow chart illustrating a method of producing a semiconductor device according to an exemplary embodiment.

FIG. 5 is a schematic flow chart illustrating a method of producing a semiconductor device according to an exemplary embodiment. First, nitride film 12 is formed, which is a material for a mask used in forming STI structure 16 (step S1). Nitride film 12 is formed on both surfaces of semiconductor substrate 11. Trenches 13 for STI structure 16 are then formed by etching using the mask (step S2). Insulating film 15 is then deposited to bury trenches 13 (step S3). Seams SE exist in deposited insulating film 15.

Stress exerted on seams SE is controlled to promote the removal of seams SE in the steam annealing step. Specifically, nitride film 12b on back surface BS of semiconductor substrate 11 is removed (step S4). After that, steam annealing step is implemented (step S5). This effectively removes seams SE in insulating film 15. Subsequently, a part of insulating film 15 is etched to form STI structure 16 (step S6). Thereafter, a semiconductor device such as an MOS transistor is formed on front surface FS of semiconductor substrate 11 (step S7).

According to the present exemplary embodiment, a stress exerted on seams SE in the deposited film is controlled to promote the removal of seams SE in the annealing step. For this reason, a problem resulting from seams in the deposited film is solved. For example, a "dent DE" is prevented from being formed on the surface of STI structure 16 to prevent short-circuit resulting from a conductor remaining in "dent DE." As a result, the yield of a semiconductor device is improved.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A method of producing a semiconductor device comprising steps of:
   (A) forming trenches on a front surface of a semiconductor substrate, said semiconductor substrate having a back surface on which a first insulating film is formed;
   (B) depositing a second insulating film to bury the trenches;
   (C) removing the first insulating film on the back surface of the semiconductor substrate after step (B); and
   (D) annealing before the second insulating film is to be etched in a subsequent step after step (C).

2. The method of producing a semiconductor device according to claim 1, wherein the second insulating film is formed by a sub-atmospheric chemical vapor deposition (SA-CVD) method in step (B).

3. The method of producing a semiconductor device according to claim 1, wherein the second insulating film is formed by an atomic layer deposition (ALD) method in step (B).

4. The method of producing a semiconductor device according to claim 1, wherein step (A) comprising:
   (A1) forming the first insulating film on the front and back surfaces of the semiconductor substrate;
   (A2) forming a mask from the first insulating film on the front surface of the semiconductor substrate by photolithography; and
   (A3) forming the trenches on the front surface of the semiconductor substrate by etching using the mask.

5. The method of producing a semiconductor device according to claim 1 further comprising steps of:
   (E) etching a part of the second insulating film after step (D) to form device isolation structure in the trenches; and
   (F) forming a semiconductor device on the front surface of the semiconductor substrate.

6. The method of producing a semiconductor device according to claim 1, wherein step (D) comprises a steam annealing step performed in an atmosphere of water vapor at temperatures of 700-950° C.

7. The method of producing a semiconductor device according to claim 6, wherein step (D) further comprises a dry annealing step performed in an inert gas at around 1100° C.

8. The method of producing a semiconductor device according to claim 1, wherein after step (D) the second insulating film is substantially free of seam lines.

9. The method of producing a semiconductor device according to claim 1, wherein the first insulating film comprises a nitride film.

10. The method of producing a semiconductor device according to claim 1, further comprising (E) removing an upper portion of the second insulating film by chemical mechanical planarization after step (D).

11. A method of producing a semiconductor device comprising steps of:
    (1) forming a first insulating film on a front surface and a back surface of a semiconductor substrate;
    (2) forming trenches on the front surface of the semiconductor substrate;
    (3) depositing a second insulating film to bury the trenches;
    (4) removing the first insulating film on the back surface of the semiconductor substrate after step (3); and
    (5) annealing before the second insulating film is to be etched in a subsequent step after step (4).

12. The method of producing a semiconductor device according to claim 11, wherein step (5) comprises a steam annealing step performed in an atmosphere of water vapor at temperatures of 700-950° C.

13. The method of producing a semiconductor device according to claim 12, wherein step (5) further comprises a dry annealing step performed in an inert gas at around 1100° C.

14. The method of producing a semiconductor device according to claim 11, wherein after step (5) the second insulating film is substantially free of seam lines.

15. The method of producing a semiconductor device according to claim 11, wherein the first insulating film comprises a nitride film.

16. The method of producing a semiconductor device according to claim 11, further comprising (6) removing an upper portion of the second insulating film by chemical mechanical planarization after step (5).

17. A method of producing a semiconductor device comprising steps of:
    (a) forming trenches on a front surface of a semiconductor substrate;
    (b) depositing an insulating film to bury the trenches while exerting a stress in such a direction that the front surface of the semiconductor substrate is convexly warped;
    (c) decreasing the stress after step (b); and
    (d) subjecting to annealing the semiconductor substrate obtained from step (c).

18. The method of producing a semiconductor device according to claim 17, further comprising etching the insulating film after step (d).

19. The method of producing a semiconductor device according to claim 17, wherein the insulating film is formed by a sub-atmospheric chemical vapor deposition (SA-CVD) method in step (b).

20. The method of producing a semiconductor device according to claim 17, wherein the insulating film is formed by an atomic layer deposition (ALD) method in step (b).

21. The method of producing a semiconductor device according to claim 17, wherein step (d) comprises a steam annealing performed in an atmosphere of water vapor at temperatures of 700-950° C.

22. The method of producing a semiconductor device according to claim 21, wherein step (d) further comprises a dry annealing step performed in an inert gas at around 1100° C.

23. The method of producing a semiconductor device according to claim 17, wherein after step (d) the insulating film is substantially free of seam lines.

24. The method of producing a semiconductor device according to claim 17, further comprising (e) removing an upper portion of the insulating film by chemical mechanical planarization after step (d).

* * * * *